(12) United States Patent
Sugaya et al.

(10) Patent No.: US 6,518,548 B2
(45) Date of Patent: Feb. 11, 2003

(54) SUBSTRATE TEMPERATURE CONTROL SYSTEM AND METHOD FOR CONTROLLING TEMPERATURE OF SUBSTRATE

(75) Inventors: Masakazu Sugaya, Kawasaki (JP); Fumio Murai, Nishitama-gun (JP); Yutaka Kaneko, Hachioji (JP); Masafumi Kanetomo, Suginami-ku (JP); Shigeki Hirasawa, Ishioka (JP); Tomoji Watanabe, Tsuchiura (JP); Tatuharu Yamamoto, Higashimurayama (JP); Katsuhiro Kuroda, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 10/084,378

(22) Filed: Feb. 28, 2002

(65) Prior Publication Data

US 2002/0113056 A1 Aug. 22, 2002

Related U.S. Application Data

(62) Division of application No. 09/526,460, filed on Mar. 16, 2000, which is a continuation of application No. 09/050,421, filed on Mar. 31, 1998, now abandoned.

(30) Foreign Application Priority Data

Apr. 2, 1997 (JP) ............................................. 9-083920

(51) Int. Cl.$^7$ ............................. H05B 3/68; C23C 16/00
(52) U.S. Cl. ..................................... 219/444.1; 118/725
(58) Field of Search ........................... 219/443.1, 444.1, 219/448.11; 118/715, 716, 720, 721, 723 VE, 724, 725, 728, 729; 423/253

(56) References Cited

U.S. PATENT DOCUMENTS 4,037,830 A    7/1977    Poluzzi et al.

(List continued on next page.)

FOREIGN PATENT DOCUMENTS

| JP | 62-16509 | 1/1987 |
| JP | 62-45378 | 2/1987 |
| JP | 62-53773 | 3/1987 |
| JP | 3-154324 | 7/1991 |

OTHER PUBLICATIONS

"Electronic Parts and Materials", Kogyochosakai Publishing Co., Ltd., 1994, pp. 77–83.

Primary Examiner—Sang Paik
(74) Attorney, Agent, or Firm—Mattingly, Stanger & Malur, P.C.

(57) ABSTRACT

So as to provide a substrate temperature control system capable of unifying the temperature of the substrate and capable of shortening the temperature elevation time (temperature lowering time), the substrate temperature control system is equipped with a temperature control plate (heating or cooling plate) having a plurality of projections on the surface and serving to set the temperature of the substrate, and a chuck mechanism to fix the substrate in contact to a plurality of the projections by chucking the substrate toward the direction of the temperature control plate.

5 Claims, 12 Drawing Sheets

U.S. PATENT DOCUMENTS

| | | |
|---|---|---|
| 4,213,698 A | 7/1980 | Firtion et al. |
| RE31,053 E | 10/1982 | Firtion et al. |
| 4,518,848 A * | 5/1985 | Weber .................. 219/388 |
| 4,551,192 A | 11/1985 | Di Milia et al. |
| 5,252,807 A * | 10/1993 | Chizinsky ............... 118/724 |
| 5,343,012 A * | 8/1994 | Hardy et al. ............. 118/725 |
| 5,382,311 A | 1/1995 | Ishikawa et al. |
| 5,383,971 A | 1/1995 | Selbrede |
| 5,458,687 A | 10/1995 | Shichida et al. |
| 5,460,684 A | 10/1995 | Saeki et al. |
| 5,474,877 A | 12/1995 | Suzuki |
| 5,478,609 A | 12/1995 | Okamura |
| 5,534,073 A | 7/1996 | Kinoshita et al. |
| 5,588,827 A | 12/1996 | Muka |
| 5,695,568 A * | 12/1997 | Sinha et al. ............. 118/500 |
| 5,721,090 A | 2/1998 | Okamoto et al. |
| 5,730,803 A | 3/1998 | Steger et al. |
| 5,738,165 A | 4/1998 | Imai |
| 5,762,714 A | 6/1998 | Mohn et al. |
| 5,820,723 A | 10/1998 | Benjamin et al. |
| 5,830,808 A | 11/1998 | Chapman |
| 5,904,776 A | 5/1999 | Donde et al. |
| 5,904,779 A | 5/1999 | Dhindsa et al. |
| 5,958,140 A | 9/1999 | Arami et al. |
| 6,245,202 B1 | 6/2001 | Edamura et al. |
| 6,394,797 B1 * | 5/2002 | Sugaya et al. ........... 118/724 |

* cited by examiner

ENLARGED GATE ELECTRODE     SHAPE OF WAFER

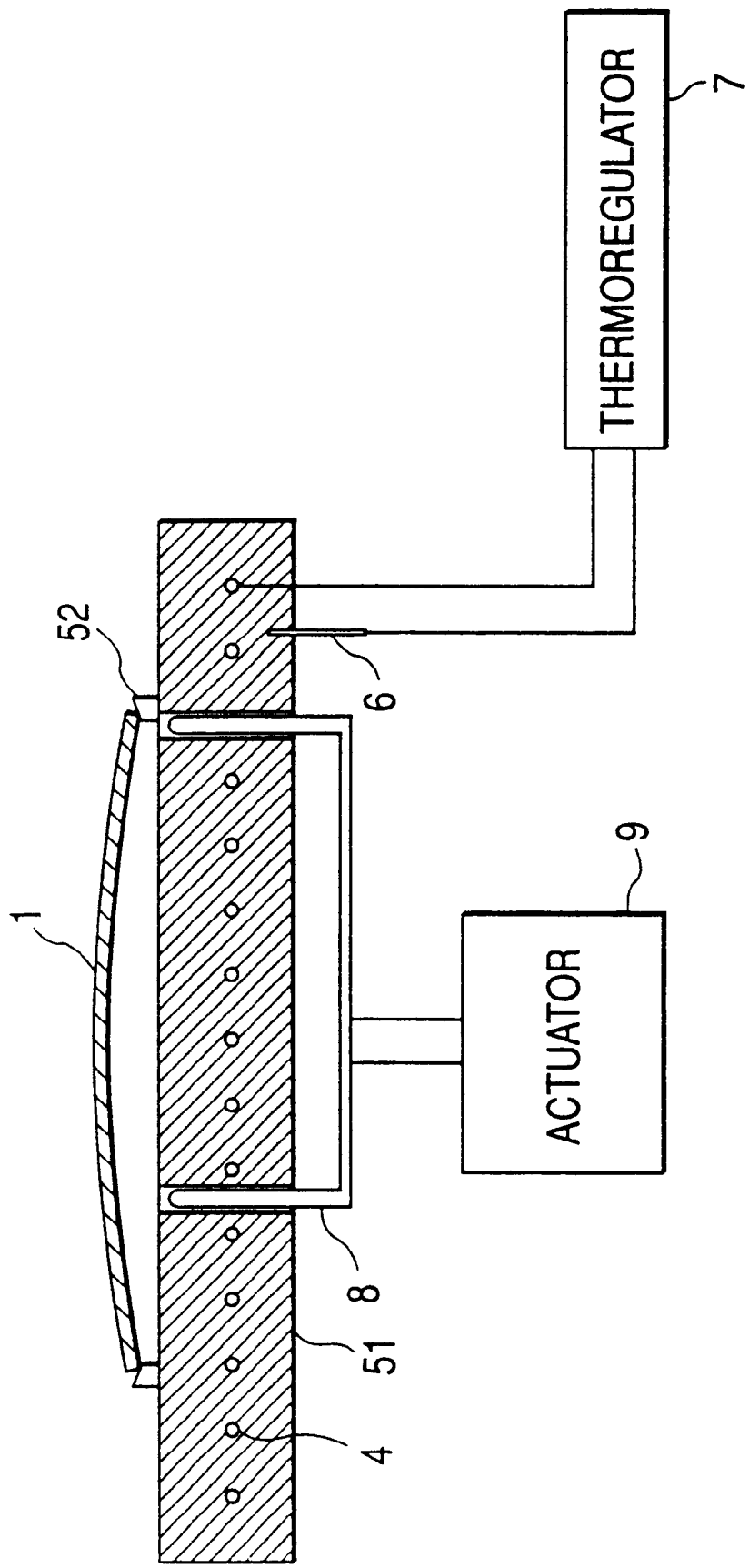

SUBSTRATE TEMPERATURE CONTROL SYSTEM AND METHOD FOR CONTROLLING TEMPERATURE OF SUBSTRATE

This is a divisional application of U.S. Ser. No. 09/526,460, filed Mar. 16, 2000; which is a continuation application of U.S. Ser. No. 09/050,421, filed Mar. 31, 1998, now abandoned.

BACKGROUND OF THE INVENTION

The present invention relates to a technique for heating or cooling a substrate; more specifically, the present invention relates to a substrate temperature control system and a method for controlling the temperature of a substrate, preferably applicable to the lithography process of producing semiconductor devices and the like.

The process of producing semiconductor devices includes a process of heating and cooling substrates; at the lithography process, in particular, heating is conducted several times in repetition. The substrate heating system includes for example a spin-coater wherein a vacuum chuck mechanism is arranged on a hot plate to which is put a substrate in close contact (for example, see Japanese Patent Laid-open No. Sho 62-53773). Additionally, as the substrate heating system, there are many examples of a system of proximity mode, by which a substrate is heated while the substrate floats slightly above a hot plate (see "Electronics Parts and Materials", published by Kogyochosakai Publishing Co. Ltd., extra number, 1994, pp. 77–83); the substrate heating system is for example a resist baking oven for a semiconductor wafer (proximity bake unit) as shown in FIG. 13. The system is used at a process after resist coating process of the substrate (semiconductor wafer), and the figure schematically shows the system. In the figure, 1 represents a semiconductor wafer with resist coated thereon; wafer 1 is transferred on an elevator mechanism composed of lift pin 8 and actuator 9 operable of moving the lift pin upward and downward and is then mounted on small block 52 arranged on the surface of hot plate 51. The hot plate 51 inside which heater element 4 is arranged is controlled to a predetermined temperature by means of thermocouple 6 and thermoregulator 7. Through the block 52, the wafer 1 is arranged in a floating fashion by about 0.1 mm apart from the hot plate 51.

Where the substrate heating system is used for post-exposure bake (referred to as "PEB") process of, for example, chemical amplified resist with the exposed part extremely temperature sensitive after lithography, the temperature variation can be controlled at about ±0.8° C.; by such proximity mode with an additional control mode of the gas stream above substrates, the temperature variation can be controlled at about ±0.3° C.

Following the high integration tendency of semiconductor devices in recent years, however, it is demanded that the temperature variation at the PEB process should be controlled to a further stricter value. However, the conventional substrate heating system cannot satisfy such demand, disadvantageously. Furthermore, the increase of semiconductor wafer size is now under way, so that the suppression of the temperature variation is more difficult than ever.

The increase of semiconductor wafer size induces the increase of thermal capacity, so that a longer time is required for the wafer to reach a desired temperature. In other words, a new problem of the prolongation of temperature elevation time occurs. A time of about 60 seconds is required to elevate the temperature of a wafer of an 8-inch size to the objective temperature of 60° C. to 150° C. The increase of temperature elevation time deteriorates the through put (production efficiency) of the production process.

Where the float distance of the substrate from the hot plate is slight as described above, gaseous heat conduction according to Fourier law of heat conduction from the hot plate to the substrate is predominant while the heat transfer through gaseous convection is negligible. As will be described below in the case of such heat conduction, the temperature difference between the substrate and the hot plate is in proportion to the float distance. Thus, the local variation of the float distance of the substrate causes the temperature variation of the substrate.

The variation of the float distance is primarily caused by substrate deformation. The deformation of semiconductor wafer increases through various processes, and the resulting shape is so complex that the shape cannot be estimated. Additionally, the deformation is unavoidably enlarged as the wafer size is increased. Therefore, it is suggested that the deformation should be corrected.

The process of putting the substrate in close contact to the hot plate as described in the aforementioned reference is one of processes of correcting the deformation of substrates, but particles deposited on the back face of the substrate and the surface of the hot plate inevitably influence the process so that the variation can hardly be suppressed routinely in a stable manner.

What has been described above is focused only on the heating system, but in a cooling system, a cooling plate is simply replaced with the hot plate, wherein the direction of heat conduction is adverse to the direction thereof in case of the hot plate. Therefore, the advantages and problems are the same as described above. Hereinbelow, heating and cooling are collectively referred to as "temperature control", and also hot plate and cooling plate are collectively referred to as "temperature control plate".

SUMMARY OF THE INVENTION

It is an object of the present invention to overcome the problems of the prior art and provide a novel substrate temperature control system capable of unifying the temperature of the substrate and capable of shortening the temperature elevation time (temperature lowering time).

The problems of the present invention can be effectively solved by placing a temperature control plate (hot plate or cooling plate) with co-planar projections on the surface thereof as well as a substrate chuck mechanism fixing the substrate on the projections by pressing the substrate along the direction of the temperature control plate.

Through the projections arranged, heat conduction through the contact surface to the projections and heat conduction through non-contact surface in a gas phase are formed between the substrate and the temperature control plate, but the heat conduction through the projections is prominent because the heat conduction through the projections is high compared with the conduction in gas. Therefore, the substrate temperature can be unified by unifying the heat transfer at the contact surface on the whole surface of the substrate. Because the efficiency of heat transfer then can be distinctively increased compared with the conventional efficiency thereof through a gas phase, furthermore, the temperature elevation time (temperature lowering time) can be shortened. Because the float distance of the substrate is regulated and aligned through the co-planar projections, the deformation of the substrate is corrected so that the substrate turns flat.

Additionally, a proposition to fix substrates by means of projections has been known as disclosed in Japanese Patent Laid-open No. Sho 62-45378. The system of the publication is a simple spin-coater for the purpose of separating a substrate from the gap for vacuum on a turn table thereby suppressing the temperature variation on the substrate, which variation develops in case that the substrate is put in close contact to a turn table with such gap. No reference is made therein about substrate heating (cooling) by utilizing temperature transfer from a temperature control plate, so that the system cannot suppress the temperature variation on a substrate to be heated.

In accordance with the present invention, furthermore, the efficiency of heat transfer is elevated as the contact surface is larger, but particles deposited on the back face of a substrate and the surface of a hot plate influence the contact surface, with the resulting higher probability of temperature variation. Experimental results suggest that the upper limit of the ratio of the contact surface to the area of the whole back face is about 60%. Alternatively, the efficiency of heat transfer is decreased as the-area of the contact surface is decreased, which induces the increase of the temperature elevation time (temperature lowering time). Experimental results suggest that the preferable lower limit of the ratio of the contact surface to the area of the whole back face is about 0.5%. Even in this case, the heat transfer through the contact surface is higher than the heat transfer through the non-contact surface. Based on experimental results, the preferable range is 20% to 50%, in particular.

The heat transfer through the contact surface between the substrate and the temperature control plate is controlled by means of thermal contact resistance. The heat quantity Q exchanged between the two can be represented by the formula (1), provided that contact surface is $S_c$ and thermal contact resistance is $R_c$.

$$Q = S_c \Delta T / R_c \quad (1)$$

Provided that the temperature difference between the substrate and the temperature control plate is uniform at any point, herein, the heat quantity exchanged between the substrate and the temperature control plate per unit area is in disproportion to the thermal contact resistance $R_c$. The variation of the resistance causes the variation of the heat quantity and the irregularity of the temperature distribution of the substrate. A formula calculating the thermal contact resistance $R_c$, generally known widely, is represented by the formula (2), provided that the roughness values of the contact surface of the substrate and the temperature control plate are $\delta_1$ and $\delta_2$, respectively; the thermal conductivities thereof are $\lambda_1$ and $\lambda_2$, respectively; the contact pressure is P; the thermal contact resistance is $R_0$; Brinel hardness is H; and the thermal conductivity of the gas in the contact surface is $\lambda_f$.

$$\frac{1}{R_c} = \left\{ \frac{1}{\frac{\delta_1}{\lambda_1} + R_0 + \frac{\delta_2}{\lambda_2}} - \frac{\lambda_f}{\delta_1 + \delta_2} \right\} \frac{P}{H} + \frac{\lambda_f}{\delta_1 + \delta_2} \quad (2)$$

The roughness values of the contact surface, namely $\delta_1$ and $\delta_2$, the thermal conductivities thereof, namely $\lambda_1$, $\lambda_2$ and $\lambda_f$, and the Brinel hardness H, are values intrinsic to a substance, while the thermal contact resistance $R_0$ is empirically determined. Hence, the thermal contact resistance $R_c$ is determined on the basis of the contact pressure P. Therefore, the vacuum pressure P is preferably controlled at a constant value, whereby the variation of the contact state between the back face of the substrate and the hot plate, which variation depends on the pressure variation, can be reduced, while the thermal contact resistance can. be retained at a constant value. Through the thermal contact resistance at such constant value, the heat transfer at the contact surface can be unified on the whole surface of the substrate, whereby the substrate temperature can be unified.

For more detailed description of the contact surface, the contact surface between the projections and the back face of the substrate comprising countless micro-projections forming the surface roughness and microfine gaseous spaces embedded between these projections, forms a thermal contact resistance, which is expressed in the item including $\lambda_f$ of the formula (2). When pressurizing along the direction of the temperature control plate of the substrate is done for example by vacuum chuck, the pressure of the gaseous space is decreased, but the gaseous thermal conductivity $\lambda_f$ is almost equal to the conductivity at ambient pressure, with less variation of the thermal contact resistance if the pressure is about 10 Torr or more. If the pressure is below the value, the gaseous thermal conductivity is lowered to increase the thermal contact resistance and decrease the thermal conductivity.

Heat transfer at the non-contact surface in the gas phase is relatively slight, and description is now made concerning the heat quantity thereof. Heat transfer through the gas between the float distance (equal to the height of the projections in accordance with the present invention) of the substrate and the temperature control plate is via convection heat transfer and thermal conduction. If the float distance is slight, heat transfer is primarily done via heat conduction while the convection heat transfer is negligible. Provided that gaseous heat conductivity is $\lambda$; the area of substrate at the non-contact surface not in contact to the projections is S; the temperature difference between the substrate and the temperature control plate is $\Delta T$; the float distance is h, the heat quantity $Q_A$ exchanged between the substrate and the heat control plate via the gaseous heat conduction at the non-contact surface is represented by the formula (3) according to the Fourier law of heat conduction.

$$Q_A = \lambda S \Delta T / h \quad (3)$$

Thus, the temperature difference $\Delta T$ is represented by the formula (4).

$$\Delta T = hQ/\lambda S \quad (4)$$

The formula (3) indicates that heat quantity $Q_A$ is larger at the same temperature difference $\Delta T$, as float distance h is smaller. Because the formula (4) can be established locally at any position of the substrate face, it is indicated that the variation of the float distance h corresponds to the variation of the temperature difference $\Delta T$. In accordance with the present invention, the float distance h is aligned under the control of the co-planar projections, and therefore, the temperature variation based on the gaseous thermal conduction can be suppressed.

Because the thermal conduction through the projections is predominant as has been described above, the limitation of the height of the projections can greatly be reduced, compared with conventional cases wherein the thermal conduction through a gaseous phase is main. For vacuum chuck, however, the height above 1 mm readily causes disorders in the gaseous stream to be chucked; 1 $\mu$m or below, the influence of particles as the problem of close contact readily occurs. Hence, the preferable range of the height of the projections is preset from 1 mm to 1 $\mu$m.

As the press mechanism to pressurize and fix the substrate along the direction of the temperature control plate, a mechanism of for example vacuum chuck or electrostatic chuck may be employed. For using a vacuum chuck mechanism, a plurality of projections are arranged, together with a vacuum seal enclosing the projections and a vacuum chuck hole, on the faces of the temperature control plate. The vacuum seal on the same plane of the projections works as a vacuum seal so as to prevent the flow of air outside the vacuum seal into the space inside the vacuum seal. By chucking the space enclosed with these projections and the vacuum seals and the substrate into a negative pressure by using a hole for vacuum, a semiconductor wafer can be fixed at an equal distance at any position of the surface of the temperature control plate. Then, the contact surface for heat transfer be formed on the projections and the vacuum seals and the back face of the substrate.

For using an electrostatic chuck mechanism, a mechanism is arranged to load an electrostatic voltage between the substrate and an electrode, by embedding the electrode into a temperature control plate prepared from an insulator.

Because the pressure generated serves as the contact pressure in any case, the pressure of the space is preferably controlled to a predetermined constant value. It is indicated for vacuum chuck that the lower limit of the pressure is 10 Torr as described above, and the upper limit is 700 Torr, from the respect of the formation of contact resistance and the preparation of a substrate with flat surface, whereby preferable results are recovered.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIG. 13 is a cross sectional view describing a substrate heating system of prior art.

DETAILED DESCRIPTION OF THE PREFERRED EMBODIMENTS

Figure 1:
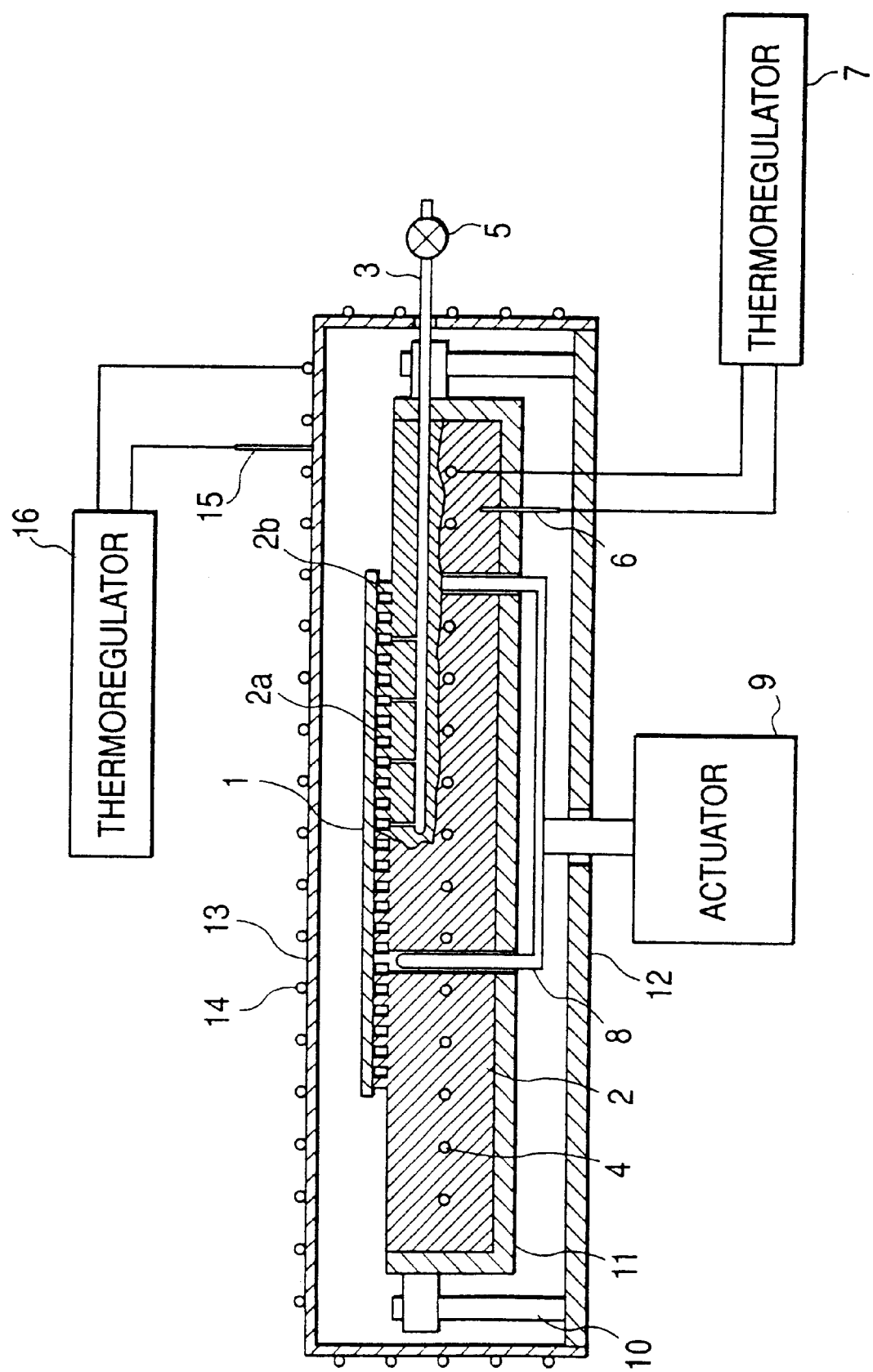
FIG. 1 is a cross sectional view describing First Embodiment of the substrate temperature control system of the present invention.

With reference to some examples shown in the drawings, the substrate temperature control system and method for controlling the temperature of a substrate in accordance with the present invention will be described in detail. The same symbols in the figures individually represent the same matters or similar matters.

First Embodiment

FIG. 1 shows an example of a substrate heating system by the present invention as applied to a resist baking oven for a semiconductor wafer. In the figure, 2 represents a hot plate arranging therein pipework for vacuum 3 and heater element 4; 2a represents a plurality of co-planar projections as arranged on the surface of the hot plate; 2b represents a vacuum seal enclosing projections 2a.

The tip of the pipework for vacuum 3 is connected to a plurality of holes for vacuum arranged on the face of the hot plate 2. Pressure regulator 5 is arranged on the pipework for vacuum 3, and the pressure to chuck wafer 1 is maintained at a predetermined value through the pressure regulator 5. The calorific value of heater element 4 is controlled by means of thermocouple 6 and thermoregulator 7 embedded in the hot plate 2, to adjust the hot plate 2 to a predetermined temperature.

In FIG. 1, furthermore, 10 represents strut supporting the hot plate 2; 11 represents a heat insulator arranged so as to avoid the transfer of the heat of the hot plate 2 to the strut 10; 12 represents a base to fix the strut 10 and work as a table of the hot plate 2. The hot plate 2 is fixed through the heat insulator 11 and strut 10 on the base 12. 13 represents a chamber fixed on the base 12; and in the chamber 13, the substrate 1 and the hot plate 2 and the like are placed. The chamber 13 is equipped with heater 14 so as to decrease the effect of outer disturbances as much as possible, and the calorific value of the heater 14 is finally adjusted through the thermocouple 15 and the thermoregulator 16 to the predetermined temperature of the chamber 13.

Figure 2:
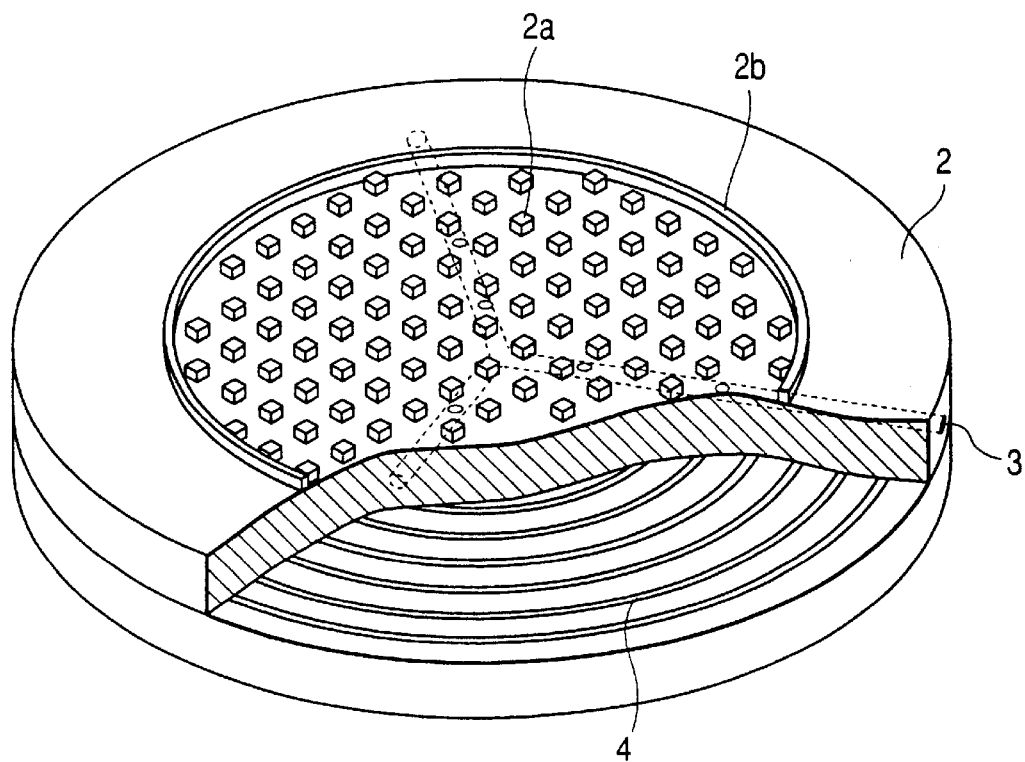
FIG. 2 is a perspective, cross sectional view describing the hot plate with projections in First Embodiment.

FIG. 2 schematically shows a view of the structure of the hot plate 2. Projections 2a are arranged so that the contact surfaces might uniformly be distributed on the back face of the wafer 1. Because the surfaces to be chucked into a negative pressure are similarly arranged in a uniform manner, even wafer 1 with any deformation can be corrected of the deformation at good precision, so that uniform contact can be recovered. By retaining the pressure at a constant level by means of pressure regulator 5, therefore, the thermal contact resistance $R_c$ can be uniformly retained on the face of the wafer 1. Consequently, heat quantity transferred from the projections 2a and the vacuum seal 2b is so uniform that the temperature distribution can be made uniform on the face of the wafer 1. By distributing uniformly the contact surfaces, furthermore, the effect of unifying the temperature distribution can be enhanced.

Still furthermore, it is needless to say that the temperature distribution of the hot plate 2 of itself should be made uniform so as to unify the temperature distribution of the wafer 1. Thus, a material with excellent thermal conductivity is effectively used as the hot plate 2. However, metal contamination should be avoided when use is made of metals such as aluminum and copper. In the present Embodiment, therefore, aluminum coated with polytetrafluoroethylene resin was used.

Figure 3:
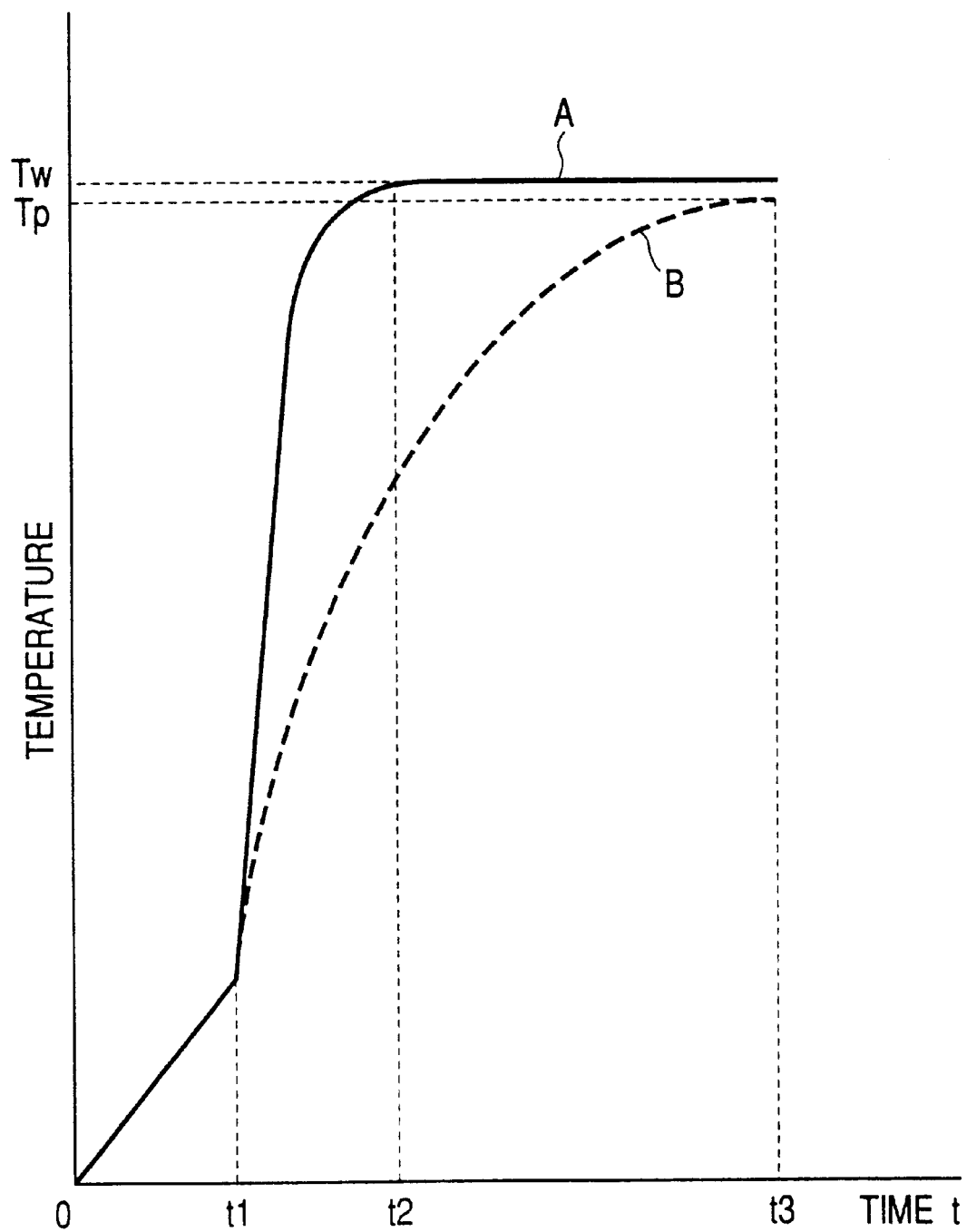
FIG. 3 is a view of curves describing the effects of First Embodiment.

FIG. 3 shows the temperature elevation characteristics of the wafer 1 used in the present Embodiment. In the figure, A represents the temperature elevation curve recovered by using the system of the present Embodiment; and B represents a general temperature elevation curve of the system of the conventional proximity mode, which is shown for comparison. When using the system of the present Embodiment, the wafer 1 is placed on lift pin 8 at time zero, and at time t1, the wafer is fixed on the hot plate 2. Subsequently, the wafer 1 reaches a temperature of 99% of objective temperature Tw at time t2. The time from the time t1 to time t2 corresponds to the temperature elevation time of the wafer 1.

The temperature elevation time is determined on the basis of the contact surface ratio of the back face of the wafer 1 to the projections 2a and the vacuum seal 2b. In the present Embodiment, the temperature elevation time was 15 seconds at a contact surface ratio of 44%. By presetting the contact surface ratio so as to satisfy the requirements of the objective temperature Tw and temperature elevation time, in accordance with the present invention, these can be preset appropriately.

For using the system of the proximity mode, alternatively, the wafer 1 is transferred into the system at time zero, to be arranged at a given position at time t1. Subsequently, the wafer 1 reaches temperature Tp by several centigrade lower than the objective temperature Tw, where the wafer 1 reaches its saturated state. The temperature elevation time then required, namely the time from t1 to t3, is generally about 60 seconds. In such manner, the temperature elevation time can prominently be shortened by the heating mode of the present invention, compared with the prior art, so that the processing time can be shortened. Thus, the through put can be improved.

Second Embodiment

Figure 4:
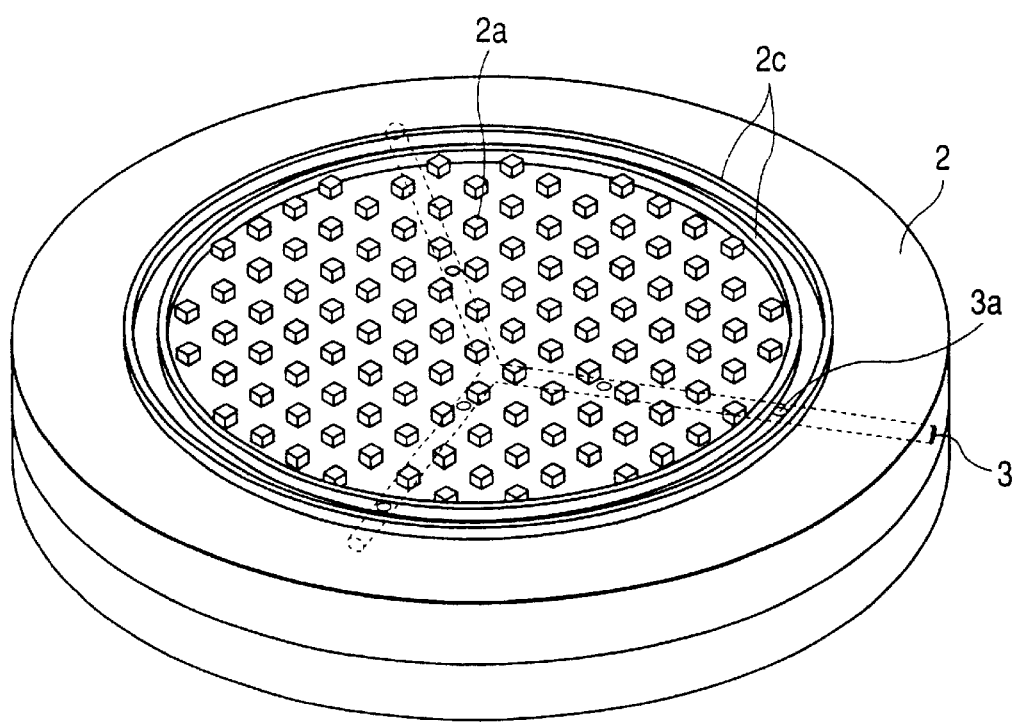
FIG. 4 is a perspective, cross sectional view describing Second Embodiment of the present invention.

FIG. 4 shows an example where a plurality of vacuum seals are arranged. In the figure, 2c represents a plurality of vacuum seals enclosing projections 2a. It is inevitable that by reducing the pressure of the space enclosed by hot plate 2 and wafer 1, air is slightly oozed out from the vacuum seal 2a (see FIG. 2) and flows into the space. Air flow causes the decrease of the temperature around the wafer 1. Accordingly, the temperature distribution of the semiconductor wafer is high at its center but is low around the periphery. So as to overcome the problem, the vacuum seal 2b enclosing a plurality of co-planar projections is altered to a structure of a plurality of vacuum seals of a concentric circle (vacuum seals 2c), and hole 3a in communication with pipework for vacuum 3 is additionally arranged between the individual vacuum seals.

In such manner, the pressure difference in the space between the vacuum seals can be made small, whereby air flow from the vacuum seals can be reduced. Thus, the temperature decrease around the wafer can be reduced. By bringing the outermost vacuum seal 2c close to the outer diameter of the wafer 2c, the adhesive lifting of the outer wafer periphery can be prevented during chucking.

Third Embodiment

Figure 5:
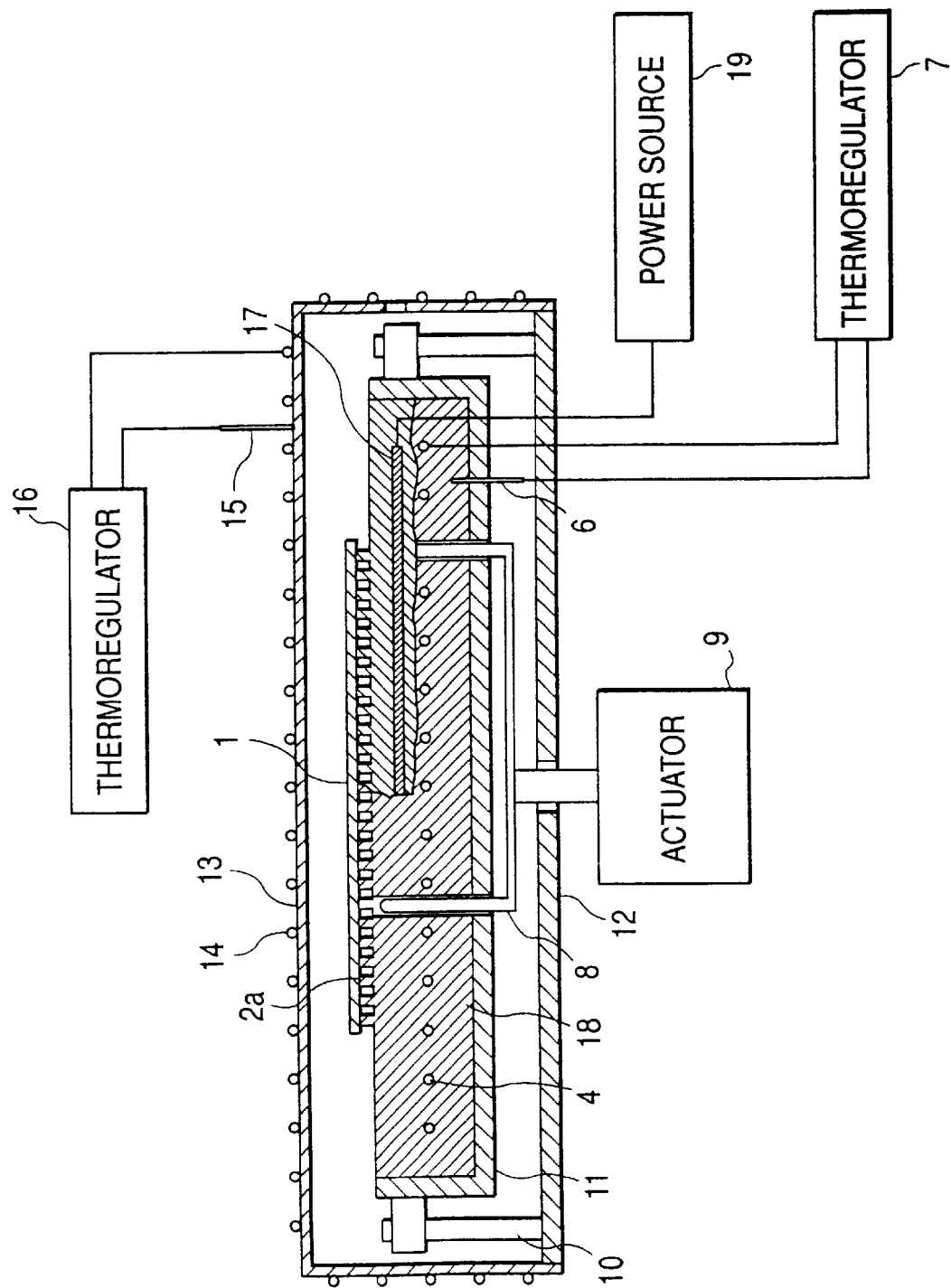
FIG. 5 is a cross sectional view describing Third Embodiment of the present invention.

FIG. 5 shows an example of a substrate heating system wherein the wafer 1 is chucked through electrostatic chuck. In the figure, 18 represents a hot plate composed of an insulating material with a plurality of co-planar projections 2a on the surface; and 17 represents a metal electrode arranged inside the hot plate 18. As the insulating material, use was made of silicon carbide (SiC), with no specific limitation; and use may be made of materials with good thermal conductivity, for example aluminium oxide ($Al_2O_3$), and AlN (aluminium nitride). 19 represents an electric power connected to metal electrode 17, which is used for adjusting the voltage to be loaded.

In the present Embodiment, positive and negative charges are generated between the surface of the hot plate 18 and the wafer 1, by loading a voltage on the metal electrode 17, and by utilizing the Coulomb power and JohnsonRahbeck effect occurring between the charges, the wafer 1 is chucked and fixed on the hot plate 18. In the present Embodiment, furthermore, not any vacuum seal for use in vacuum chuck is required.

In the present Embodiment, a constant contact pressure can be loaded uniformly on wafer 1 by adjusting the voltage to be loaded, and like the First Embodiment, the thermal contact resistance $R_c$ can be retained uniformly on the face of the wafer 1. Consequently, heat quantity transferred from each projection is so uniform that the temperature distribution on the face of the wafer 1 can be made uniform.

Essentially, the invention shown in the present Embodiment does not require any pressure difference from ambient pressure for chucking, and therefore, the invention may be used in atmosphere with no sufficient pressure difference for chucking.

In the present Embodiment, furthermore, the electrode is monopolar, with no specific limitation, but the electrode may be bipolar with the resulting same effects. If the electrode is bipolar, two electrodes should be arranged on the same plane inside the hot plate 18, to load a voltage between the two electrodes.

Fourth Embodiment

Figure 6:
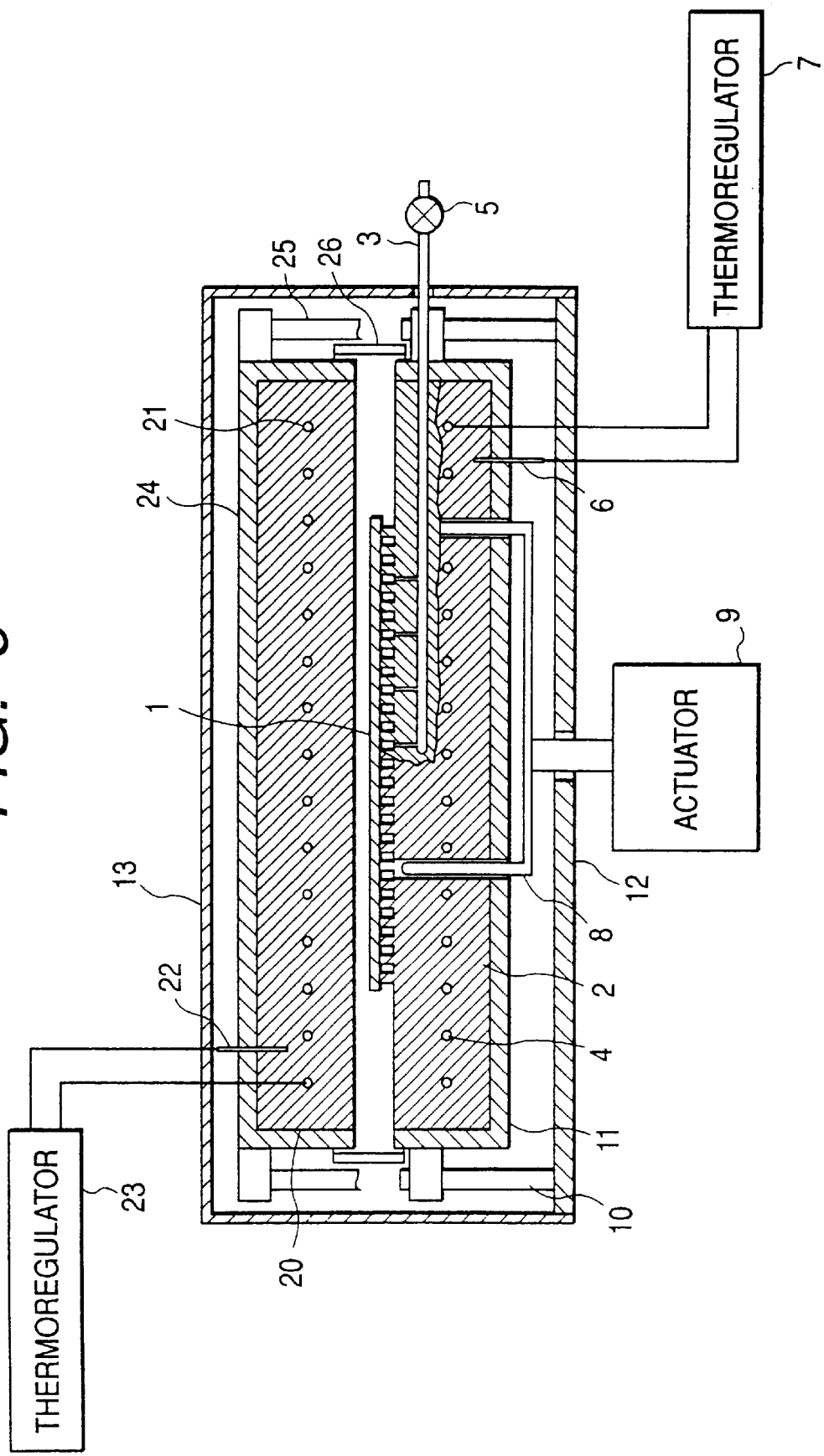
FIG. 6 is a cross sectional view describing Fourth Embodiment of the present invention.

FIG. 6 shows an example of a substrate heating system wherein a supplementary hot plate is arranged on a position opposing to hot plate 2 on substrate 1. In the figure, 20 represents the supplementary hot plate arranging heater element 21 inside. The supplementary hot plate 20 is arranged apart from the substrate 1. The measured value of thermocouple 22 embedded in the supplementary hot plate 20 is input into thermoregulator 23, which works to adjust the calorific value of the heater element 21 so that the temperature of the supplementary hot plate 20 might be at a given value. Additionally, the supplementary hot plate 20 is supported through insulating material 24 with strut 25.

In the figure, additionally, 26 represents a shutter interlocked with lift pin 8, which works to block the side face of the space interposed between upper and lower hot plates. By using such mechanism, the space serving to heat the wafer 1 is sealed to realize the shortening of the temperature elevation time of the wafer 1 and the reduction of the effects of the gas present on the upper surface of the wafer 1.

Fifth Embodiment

Figure 7:
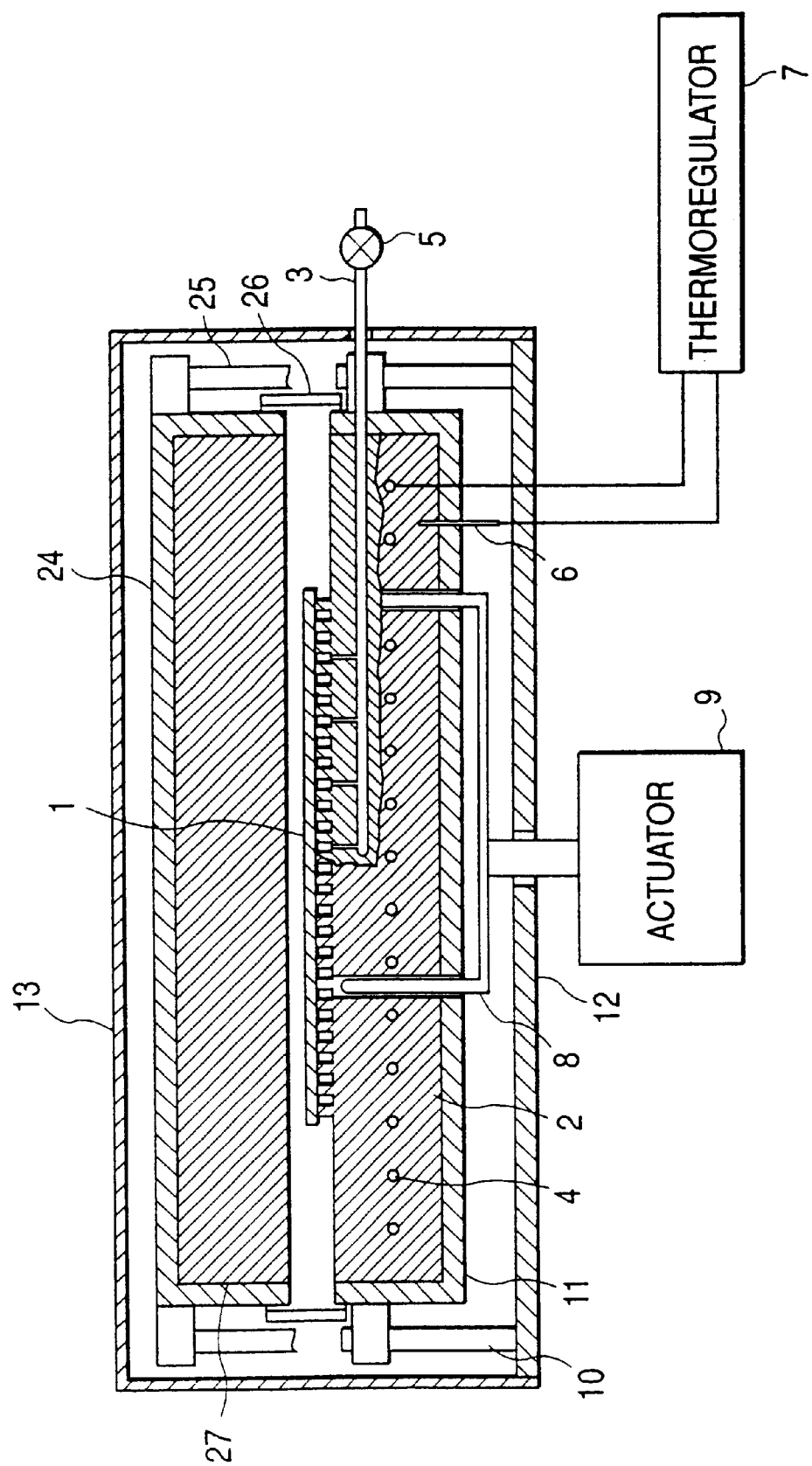
FIG. 7 is a cross sectional view describing Fifth Embodiment of the present invention.

FIG. 7 shows an example wherein a supplementary hot plate without any inner heater element because of omission is used. In the figure, 27 represents a supplementary hot plate with the same heat capacity as that of the hot plate 2. Prior to the transfer of the wafer 1 into the system, the supplementary hot plate 27 is sufficiently heated on the hot plate 2, to a final temperature of about the temperature of the hot plate 2, which is subjected for use.

Compared with Fourth Embodiment, the present Embodiment does not require heater elements or temperature adjusting parts inside the supplementary hot plate, and hence, the present Embodiment can realize the same effects at low cost.

Sixth Embodiment

FIGS. 8A to 8D partially depict a method for heating a substrate by using the substrate heating system of First Embodiment. The figures show the processes up to the fixation of wafer 1 on hot plate 2.

Figure 8A:
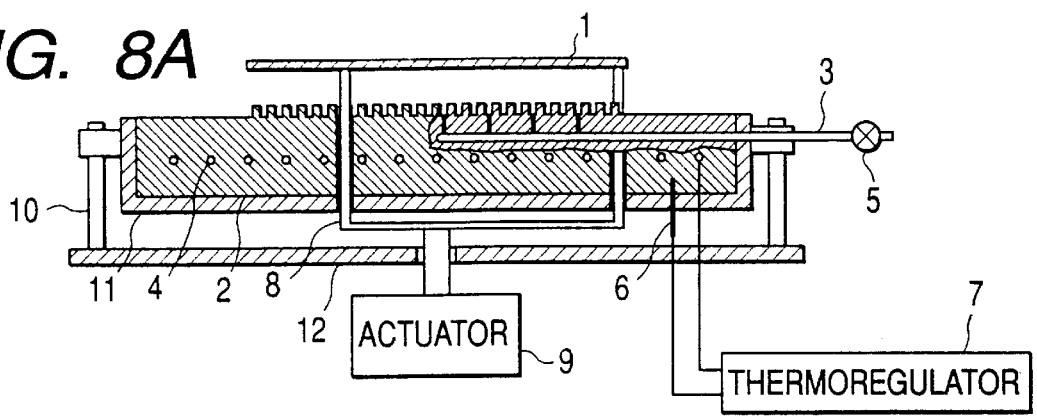
FIG. 8A is a first cross sectional view describing Sixth Embodiment of the present invention.
Figure 8B:
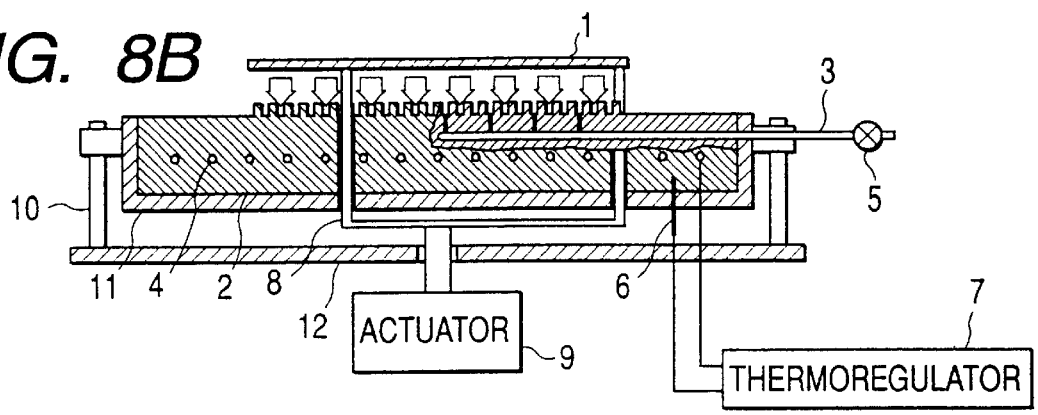
FIG. 8B is a second cross sectional view describing Sixth Embodiment of the present invention.
Figure 8C:
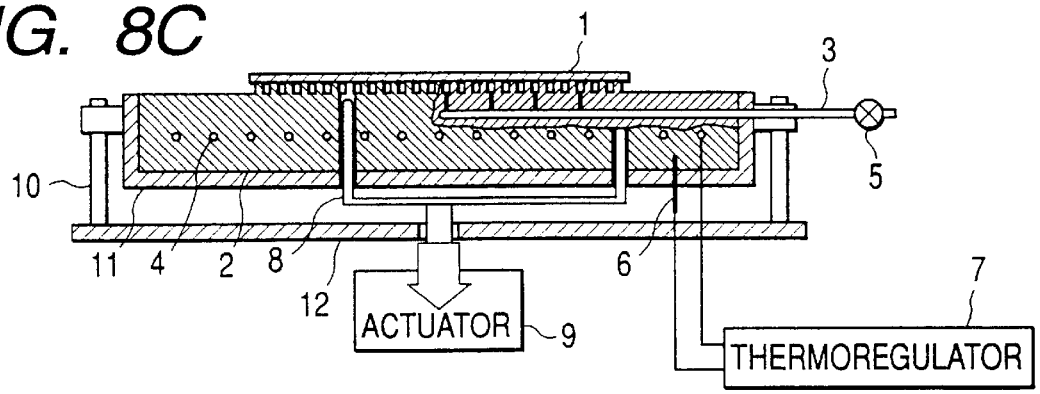
FIG. 8C is a third cross sectional view describing Sixth Embodiment of the present invention.
Figure 8D:
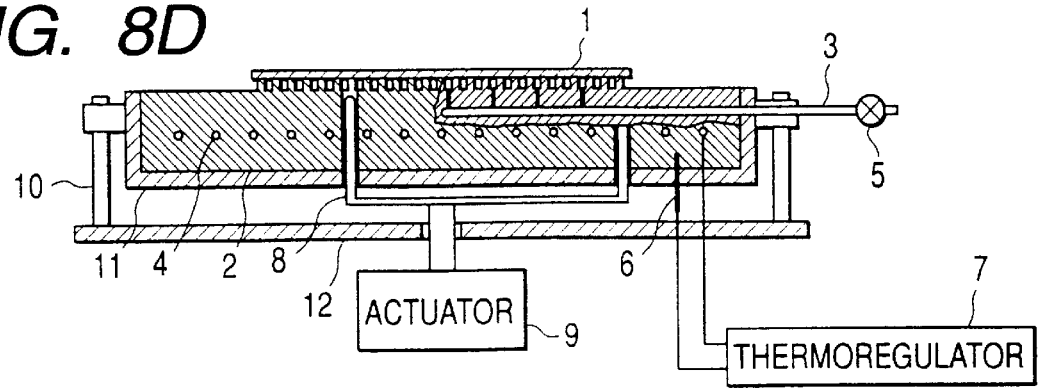
FIG. 8D is a fourth cross sectional view describing Sixth Embodiment of the present invention.

By means of transfer robot and the like (not shown in the figures), the wafer 1 is transferred onto lift pin 8 (FIG. 8A). Prior to lowering the lift pin 8, then, the pressure regulator 5 is opened to start chucking so as to prepare a state capable of immediate chucking (FIG. 8B). Thereafter, the lift pin 8 is lowered (FIG. 8C), to fix the wafer 1 on the projections 2a on the hot plate 2 (FIG. 8D).

Through the processes described above, the wafer 1 is mounted on the hot plate 2 after the chucking mechanism initiates its operation, so that the wafer 1 can initiate temperature elevation immediately, while the variation of temperature distribution during temperature elevation is suppressed at minimum. Even if the hot plate 2 is slanted to the wafer 1 prior to mounting, the wafer 1 can be fixed on a given position with no sliding on the hot plate 2.

The method by using the substrate heating system of the First Embodiment has been described insofar, and in the substrate heating systems of Second to Fifth Embodiments, similarly, chucking starts prior to lowering the lift pin 8. For using electrostatic chucking in Third Embodiment, a voltage is loaded on inner electrode 17 to initiate chucking, prior to lowering the lift pin 8.

Seventh Embodiment

FIGS. 9A to 9D show partially the production process of a MOS (metal oxide semiconductor)-type transistor by using the substrate heating system of First Embodiment. The figures are cross sectional views of the treatment processes of a gate electrode of the MOS-type transistor. On the right sides of FIGS. 9A to 9D is shown the cross sectional structure of the deformation of the overall wafer 1, while the cross sectional structure of the gate electrode is enlarged and depicted on the left side.

Figure 9A:
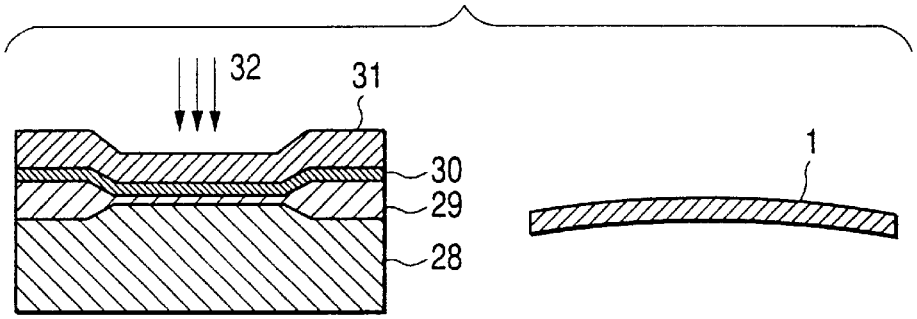
FIG. 9A is a first cross sectional view describing Seventh Embodiment of the present invention.

The active region of the transistor is isolated from silicon substrate 28 by silicon oxide film 29, and is wholly coated with polysilicon 30. For processing the gate electrode, in the present Embodiment, a negative-type chemical amplified resist is coated under rotation, to form resist layer 31. Thereafter, electron beam 32 was used for exposure of a given region of the resist layer 31 (FIG. 9, left side). Instead of electron beam, furthermore, essentially the same process may be employed for ultraviolet ray or X ray to be used. In these cases, different lithography systems and resist materials are used. When using positive-type resists, exposure regions should be reversed. At the step, the shape of the wafer 1 is a shape with warp, due to the presence of the coated matter (FIG. 9A, right side).

Figure 9B:
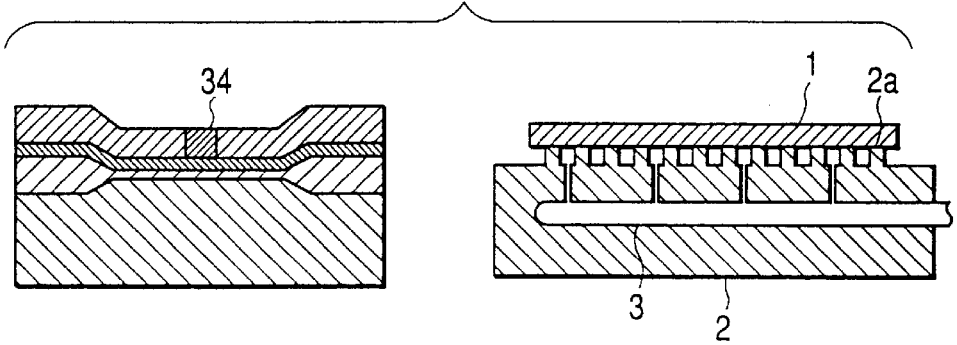
FIG. 9B is a second cross sectional view describing Seventh Embodiment of the present invention.

As shown in FIG. 9B, the exposed wafer 1 is placed on a plurality of projections 2a and a vacuum seal (not shown in the figure) as arranged on the hot plate 2, and by vacuum chucking the back face through pipework for vacuum 3, the warp of the wafer 1 can be corrected. At the state realized, heating was started. The temperature distribution on the face of the wafer was approximately slightly below ±0.1° C. For comparison, furthermore, the temperature distribution with heating but without correction of the wafer shape was measured as ±0.8° C., which suggests the effects of the correction. Additionally, the contact area ratio of the wafer 1 to the projections 2a and the vacuum seal was 40%. The heating conditions of the present resist were 110° C. for 2 minutes. As the consequence of heating, latent image 34 was formed in an exposure region in the resist (FIG. 9B). The above-mentioned process corresponds to a method for treating a substrate.

Figure 9C:
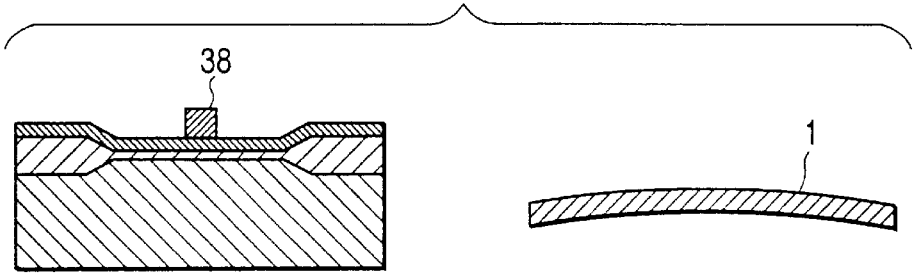
FIG. 9C is a third cross sectional view describing Seventh Embodiment of the present invention.
Figure 9D:
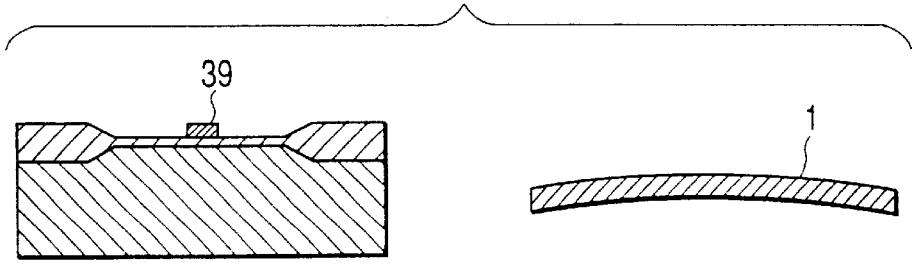
FIG. 9D is a fourth cross sectional view describing Seventh Embodiment of the present invention.

By carrying out the development process of the resist 31 by using an alkaline aqueous solution, resist pattern 38 shown in FIG. 9C was recovered. By etching polysilicon by using reactive dry etching in fluoride based gas plasma, gate electrode 39 was recovered (FIG. 9D). The mean dimension of the polysilicon gate electrode 39 was 0.2 $\mu$m, while the dimensional distribution on the face of the wafer 1 was controlled within a range of ±0.02 $\mu$m. When the value was compared with the dimensional distribution of ±0.06 $\mu$m for post-exposure baking process with no warp correction of the wafer, it was indicated that the precision was improved by 3-fold or more.

Because processing velocity and long-term reliability greatly depend on the process and precision of gate electrode in LSI, LSI with less dimensional variation of the gate electrode 39 as recovered by the present invention can exert higher performance consequently. Therefore, one of the effective application examples of the system and method of the present invention includes resist baking process for LSI processing (logic LSI gate processing), in particular, as described in the present Embodiment.

In the present Embodiment, the substrate heating system of First Embodiment was used, but the substrate heating system of any of Second to Fifth Embodiments may be used satisfactorily, with the same resultant effects.

Eighth Embodiment

Figure 10:
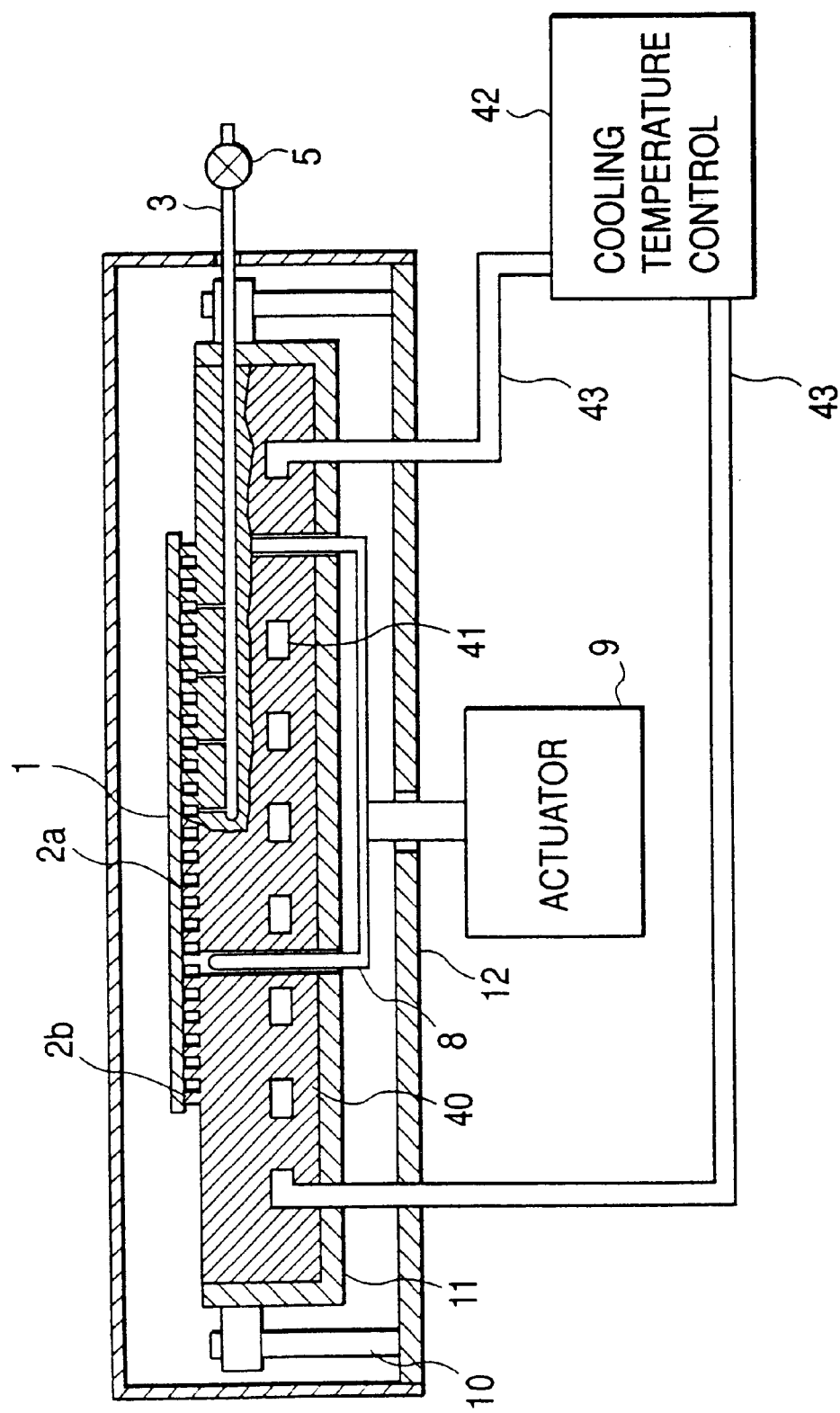
FIG. 10 is a cross sectional view describing Eighth Embodiment of the present invention.

FIG. 10 depicts an example of a substrate cooling system. In the figure, 40 represents a cooling plate with pipework for vacuum 3 and passage 41 arranged inside to circulate coolant. on the surface of the cooling plate 40 are arranged a plurality of co-planar projections 2a and a vacuum seal 2b enclosing the projections 2a, like the hot plate 2 shown in the above-mentioned Embodiment. Additionally, 42 is a unit controlling the temperature of the coolant. In the present Embodiment, water was used as the coolant, and therefore, a thermoregulator for coolant was used as unit 4. 43 represents a passage for feeding the coolant into the passage 41 and circulating the coolant.

The present Embodiment has the same structure as that of the substrate heating system of the aforementioned Embodiment, except that the temperature controller is coolant 40. Like the substrate heating system, therefore, the temperature of substrate 1 can be controlled to the temperature of the coolant 40, with a uniform temperature distribution and for a short temperature lowering time.

In the present Embodiment, furthermore, vacuum chuck was used as a means for chucking and fixing the substrate 1 on the coolant 40, but as shown in the above-mentioned Embodiment, electrostatic chuck may satisfactorily be used as a chucking mechanism, whereby the same effects can be gained. In that case, additionally, it is needless to say that a structure with a supplementary coolant arranged on the opposite surface of the substrate 1 may satisfactorily be employed, and like the case of the substrate heating system, the shortening of the temperature lowering time of the wafer 1 can be attained, along with the reduction of the effects of the gas present on the upper face of the wafer 1.

Ninth Embodiment

Figure 11:
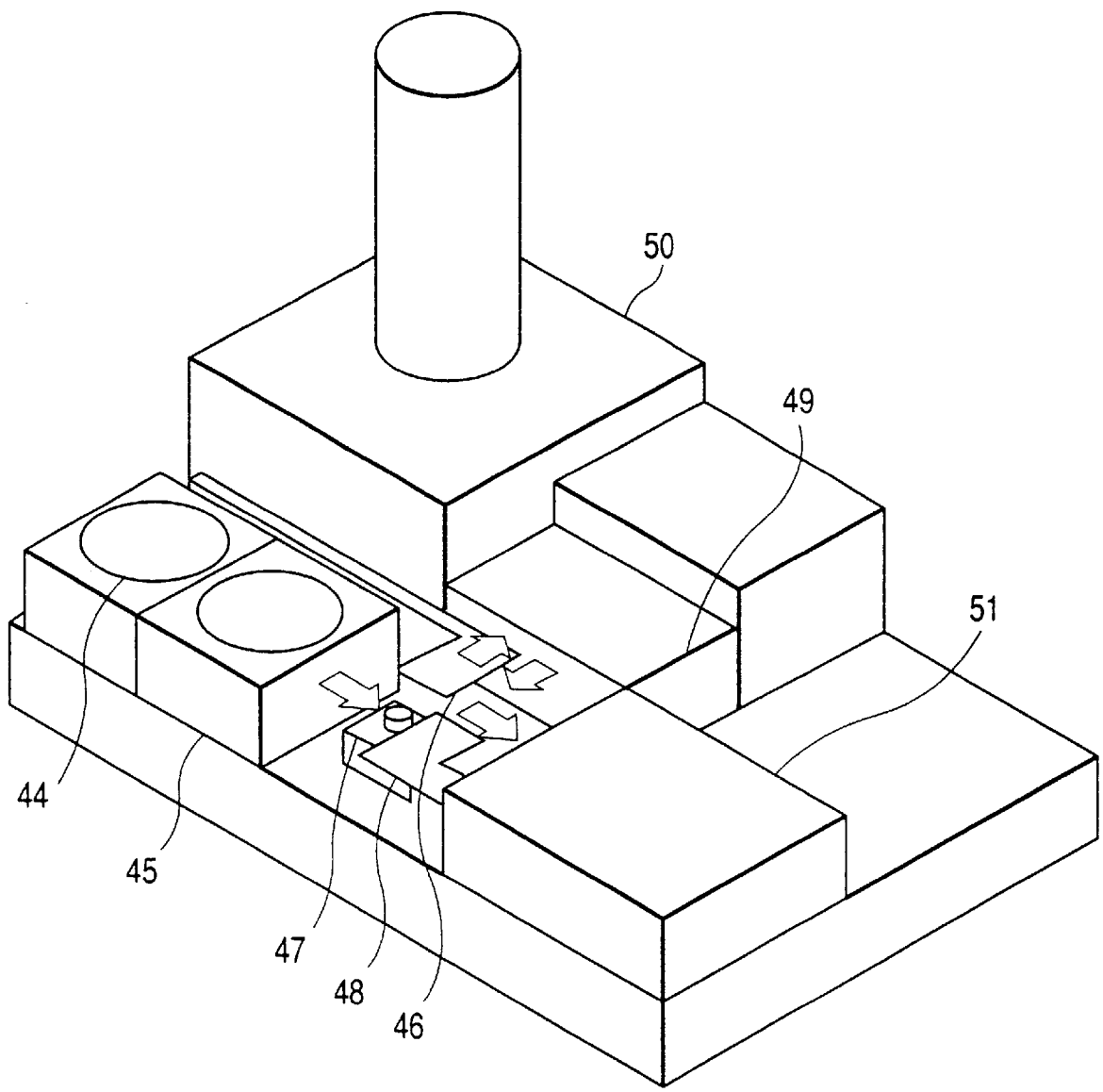
FIG. 11 is a perspective view describing Ninth Embodiment of the present invention.

FIG. 11 depicts an example of a semiconductor processing system with a substrate heating system and a lithography system, arranged therein in integration. In the figure, 44 represents a semiconductor wafer coated with resist; 45 represents a wafer cassette placing the wafer 44 therein; 50 represents an electron beam lithography system; 51 represents the substrate heating system of any of First to Fifth Embodiments.

The wafer 44 is transferred through transfer arm 46 to adjusting unit for wafer orientation flat 47, where the orientation flat is adjusted to a given position, and the wafer is then transferred through transfer arm 48 inside exhaust chamber 49. The wafer 44 is lithographed by electron beam lithography system 50 and is then transferred back to the exhaust chamber 49 and is then transferred into the adjusting unit for wafer orientation flat 47 via the transfer arm 48. For heating process, subsequently, the wafer 44 is immediately transferred to the substrate heating system 51 by using the transfer arm 46.

When the semiconductor wafer is left to stand in atmosphere after lithography, the lithographed pattern is variable due to chemical contamination or the like, to cause difficulty in recovering a pattern at a high precision, problematically. The problem can effectively be overcome by heating the semiconductor wafer immediately after lithography and stabilizing the lithographed resist pattern on the semiconductor wafer. So as to solve the problem, in the present Embodiment, the substrate heating system 51 was integrated with the electron beam lithography system 50.

In the present Embodiment, furthermore, the electron beam lithography system is illustrated as one example, but the lithography system is not limited to this. Exposure systems using electromagnetic waves capable of exposing resist, for example ultraviolet ray or X ray, may be used satisfactorily, and the same effects can be recovered.

Tenth Embodiment

Figure 12:
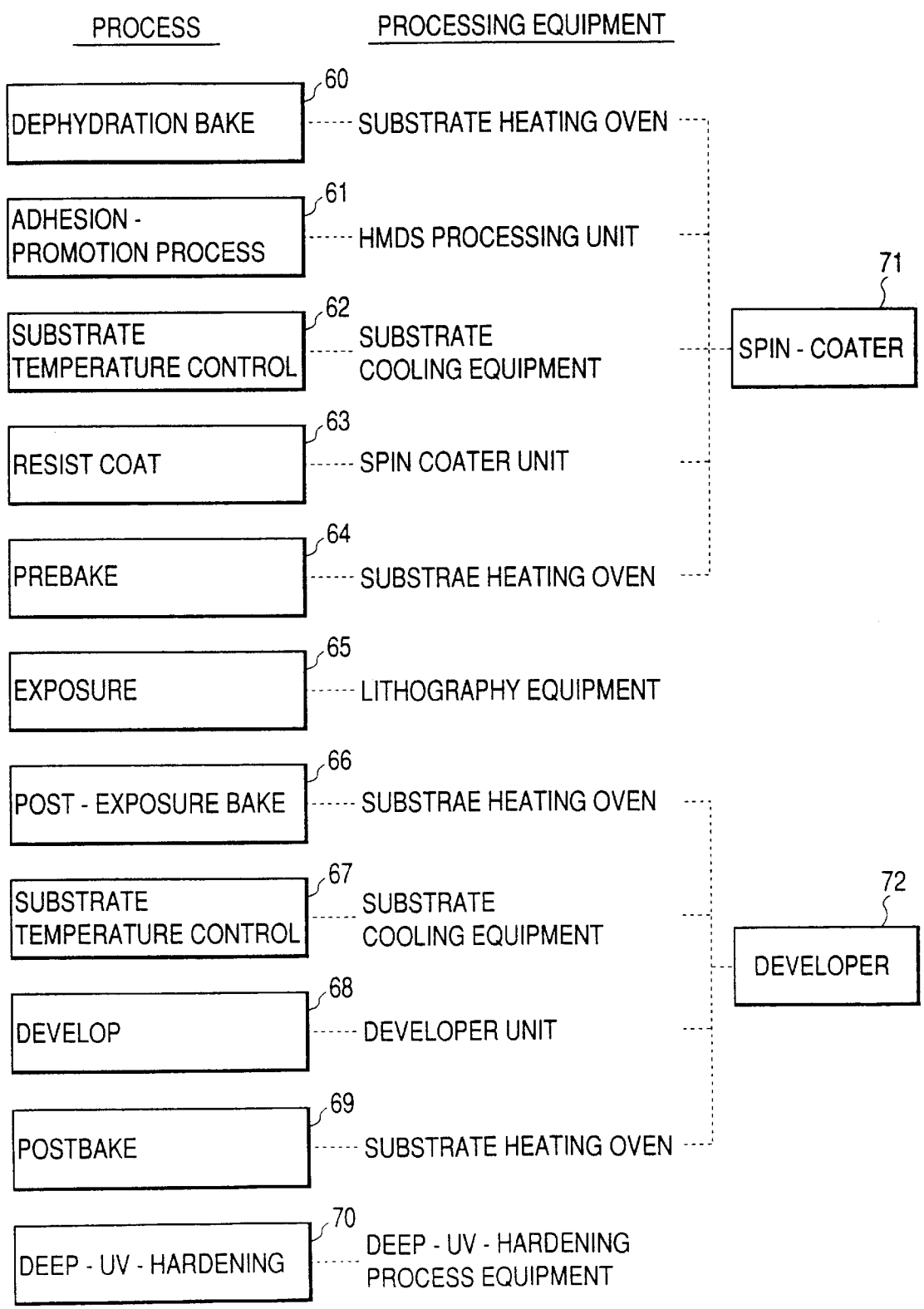
FIG. 12 is a process chart describing Tenth Embodiment of the present invention.

FIG. 12 shows a lithography process included in a method for fabricating a semiconductor device by using any of the substrate heating systems of First to Fifth Embodiments and the substrate cooling system of Eighth Embodiment. Each process of the lithography process is shown on the left row of the figure; and processing systems used at each process are shown on the right row thereof.

A semiconductor wafer introduced into the lithography process is firstly subjected to dehydration bake 60, for the purpose of processing to prevent the reduction of resist adhesion due to the water adsorbed on the surface. Subsequently, adhesion-promotion process 61 with hexamethylenedisilazane is performed. After the termination of the process, the semiconductor wafer is put at a state of ambient temperature after the process of substrate temperature control 62, for resist coating at resist coating 63. Resist coating is carried out by a process of dropwise adding resist onto the wafer while rotating the wafer. Subsequently, the wafer is subjected to prebake 64 at about 80 to 100° C. on the hot plate, for the drying process of the solvent in the resist.

The processes insofar are continuously carried out by using each unit in coater (resist coater) 71 as one of the resist processing system. The substrate heating system and substrate cooling system of the present invention are placed as the units in the coater 71; the substrate heating system is used for pre-coating bake 60 and prebake 64, while the substrate cooling system is used at the substrate temperature control 62.

Subsequently, the semiconductor wafer is subjected to pattern exposure process 65 by means of a lithography system with electron beam to be applied thereto. As the lithography system, additionally, use may satisfactorily be made of systems with ultraviolet ray or X ray to be applied thereto. After exposure, the semiconductor wafer is subjected to PEB process 66 on the hot plate, and is then put back at a state of ambient temperature at the process of substrate temperature control 67, followed by a process of development 68. After development, the semiconductor wafer is rinsed in water, and water in the resist is evaporated at the process post-bake 69.

The processes from the PEB process to the postbake 69 are continuously carried out by using each unit in a system called as developer (developing machine) 72. The developer is a semiconductor processing system having a processing chamber for treating a semiconductor wafer. The substrate heating system and substrate cooling system of the present invention are placed as the units in the chamber of developer 72, and the substrate heating system is used at the PEB process and the postbake 69, while the substrate cooling system is used at substrate temperature control 67.

After the processes mentioned hereinabove, the semiconductor wafer is discharged from the lithography process, and is subjected to DUV (deep-UV-hardening process) 70 after the postbake 69 if necessary, to be then transferred to the next process. The DUV process 70 herein may be included as one unit of the developer 72.

For using a chemical amplified resist as a resist material, as has been described above, the planar temperature distribution of the wafer at the PEB process after exposure is significant, so as to recover a highly precise pattern. In the present Embodiment, the planar temperature distribution of the semiconductor wafer could be suppressed at ±0.1° C. by using the substrate heating system of the present invention at the PEB process. Furthermore, the contact surface ratio of the back face of the semiconductor wafer to the projections was preset to 40%.

The invention achieved by the present inventors has been described specifically with reference to the examples, with no specific limitation. Without departing from the scope of the invention, satisfactorily, the present invention may be modified. For example, the system for heating the semiconductor wafer is not limited to baking oven for resist, but the invention is widely applicable to general processing systems requiring uniform heating or cooling of the wafer.

In accordance with the present invention, the use of a substrate temperature control system with a vacuum chuck face or an electrostatic chuck face with a plurality of co-planar projections can correct the deformation of a substrate to be heated or cooled; by uniformly distributing the contact surfaces between the back face of the substrate and the projections on the substrate surface, the thermal contact resistance of the contact surfaces can be uniformly retained on the back face, whereby the uniformity of the temperature distribution of the substrate surface can be improved. The heat exchange between the substrate and the temperature control is predominantly carried out through the projections with a larger thermal conductivity than those of gases, and therefore, the temperature elevation (temperature lowering)

time can be shortened. Thus, the through put at the production process can be improved.

It is further understood by those skilled in the art that the foregoing description is a preferred embodiment of the disclosed device and that various changes and modifications may be made in the invention without departing from the spirit and scope thereof.

What is claimed is:

1. A method for treating a substrate by using a substrate temperature control system comprising a temperature control plate having a plurality of projections on the surface and serving to set the temperature of a substrate, and a chuck mechanism to fix the substrate in contact to the plurality of projections by chucking the substrate toward the direction of the temperature control plate, wherein the contact area of the temperature control plate to the substrate is within a range of 60% to 0.5% of the back area of the substrate while the substrate is chucked and fixed on the temperature control plate, comprising the steps of:

coating resist on the substrate; and fixing the substrate coated with the resist on the projections by using the chuck mechanism and thereafter carrying out the temperature control of the substrate.

2. A method for treating a substrate by using a substrate temperature control system comprising a temperature control plate having a plurality of projections on the surface and serving to set the temperature of a substrate, and a chuck mechanism to fix the substrate in contact to the plurality of projections by chucking the substrate toward the direction of the temperature control plate, wherein the contact area of the temperature control plate to the substrate is within a range of 60% to 0.5% of the back area of the substrate while the substrate is chucked and fixed on the temperature control plate, comprising the steps of:

coating chemical amplified resist on the substrate;

exposing the chemical amplified resist on the substrate to any one selected from ultraviolet ray, electron beam and X ray; and fixing the substrate coated with the resist on the projections by using the chuck mechanism and thereafter carrying out the temperature control of the substrate.

3. A semiconductor processing system comprising a processing chamber for treating a semiconductor wafer, the processing chamber being equipped with a substrate temperature control system comprising a temperature control plate having a plurality of projections on the surface and serving to set the temperature of a substrate, and a chuck mechanism to fix the substrate in contact to the plurality of projections by chucking the substrate toward the direction of the temperature control plate;

wherein the contact area of the temperature control plate to the substrate is within a range of 60% to 0.5% of the back area of the substrate while the substrate is chucked and fixed on the temperature control plate; and wherein the substrate is the semiconductor wafer.

4. A semiconductor processing system produced by integrating together a substrate temperature control system and any one of an ultraviolet exposure system, an electron beam system and an X ray exposure system, wherein the substrate temperature control system comprises a temperature control plate having a plurality of projections on the surface and serving to set the temperature of a substrate, and a chuck mechanism to fix the substrate in contact to the plurality of projections by chucking the substrate toward the direction of the temperature control plate, wherein the contact area of the temeprature control plate to the substrate is within a range of 60% to 0.5% of the back area of the substrate while the substrate is chucked and fixed on the temperature control plate, and wherein the substrate to be temperature controlled is a semiconductor wafer coated with resist.

5. A method for fabricating a semiconductor, comprising the steps of:

coating resist on a semiconductor wafer;

carrying out any one of exposure and lithography of the resist on the substrate by selecting any one of ultraviolet ray, electron beam and X ray; and conducting the post-exposure bake of the semiconductor wafer after any one of the exposure and lithography by using a substrate temperature control system comprising a temperature control plate having a plurality of projections on the surface and serving to set the temperature of a substrate, and a chuck mechanism to fix the substrate in contact to the plurality of projections by chucking the substrate toward the direction of the temperature control plate;

wherein the contact area of the temperature control plate to the substrate is within a range of 60% to 0.5% of the back area of the substrate while the substrate is chucked and fixed on the temperature control plate; and wherein the substrate is the semiconductor wafer.

* * * * *